United States Patent
Suzuki

(10) Patent No.: US 6,381,002 B1
(45) Date of Patent: Apr. 30, 2002

(54) PROCESS FOR CONTROLLING A GAP BETWEEN A MASK AND A WORKPIECE IN PROXIMITY EXPOSURE AND A PROXIMITY EXPOSURE DEVICE

(75) Inventor: Shinji Suzuki, Kawasaki (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/343,710

(22) Filed: Jun. 30, 1999

(30) Foreign Application Priority Data

Jul. 9, 1998 (JP) .......................................... 10-194289

(51) Int. Cl.[7] .......................... G03B 27/42; G03B 27/52
(52) U.S. Cl. .......................................... 355/53; 355/55
(58) Field of Search ............................. 355/53, 55, 73; 356/399, 400, 401; 378/34

(56) References Cited

U.S. PATENT DOCUMENTS

| | | | | |
|---|---|---|---|---|
| 5,182,615 A | * | 1/1993 | Kurosawa et al. | 356/400 |
| 5,640,227 A | * | 6/1997 | Kato et al. | 355/53 |
| 5,737,064 A | * | 4/1998 | Inoue et al. | 355/73 |
| 6,144,719 A | * | 11/2000 | Hasegawa et al. | 378/34 |

FOREIGN PATENT DOCUMENTS

| | | |
|---|---|---|
| EP | 0 867 775 | 9/1998 |
| JP | 4-307550 | 10/1992 |

* cited by examiner

Primary Examiner—Russell Adams
Assistant Examiner—Peter B. Kim
(74) Attorney, Agent, or Firm—Nixon Peabody LLP; David S. Safran

(57) ABSTRACT

A process and device are provided for controlling a gap between a mask and a workpiece in a proximity exposure device in which there are only a few processes of measurement of the exposure gap and parallel adjustment, in which even for a large workpiece the gap between the mask and the workpiece can be controlled without contact of the workpiece with the mask, and in which no special skill is needed to adjust the gap. The process and device includes moving a workpiece carrier composed of a first movement device and a second movement device, the latter being located on a carrier driven by the first movement device and consisting of several workpiece carrier support parts which move the workpiece carrier up and down and control its slope. The size of the gap between the bottom of a mask and the top of a workpiece located on the workpiece carrier is measured at several locations. Based on the size of the gap, the positions of the workpiece carrier support parts, when the several workpiece carrier support parts move, are recorded as a parallel zero point in a control element. The motion of the workpiece carrier support parts is executed such that the workpiece carrier is located parallel to the mask. When starting to use the device, the workpiece carrier support parts are each in a standby state after they have been moved to the parallel zero points recorded in the control element. When the workpiece is being exposed, it is placed on, and held securely to, the workpiece carrier and raised by means of the first movement device until the alignment gap position is reached.

2 Claims, 5 Drawing Sheets

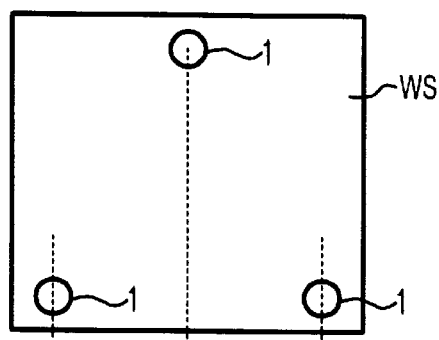
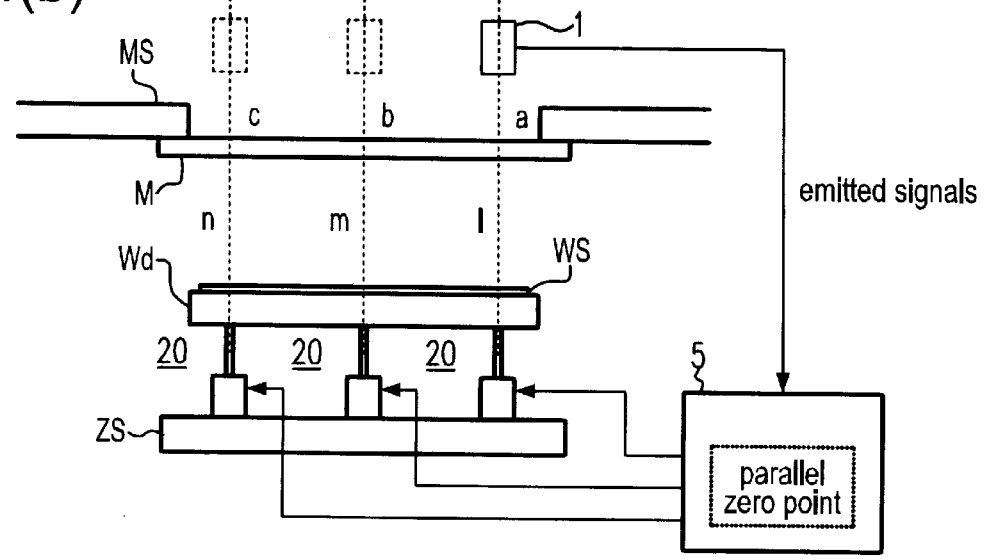

PROCESS FOR CONTROLLING A GAP BETWEEN A MASK AND A WORKPIECE IN PROXIMITY EXPOSURE AND A PROXIMITY EXPOSURE DEVICE

BACKGROUND OF THE INVENTION

1. Field of the Invention

The production of a semiconductor device, a printed board, a LCD and similar devices comprises an exposure process in which exposure light containing UV radiation is emitted via a mask onto a workpiece and thus a mask pattern is transferred to the workpiece. The invention relates to both a process for controlling a gap between the mask and the workpiece in a proximity exposure device and to a proximity exposure device.

2. Description of Related Art

The term "proximity exposure device" is generally defined as an exposure device in which a workpiece is located at a stipulated distance parallel to a mask. Exposure light is emitted via the mask and a mask pattern which has been formed on the mask is transferred to the workpiece. During exposure, there is therefore a need for a stipulated gap between the mask and the workpiece and for a parallel arrangement of the two to one another.

FIG. 5 schematically shows the basic arrangement of a proximity exposure device. In the figures, reference letter M indicates a mask on which a mask pattern is formed and which is held securely in a mask carrier MS by vacuum suction or other securing means. Above the mask carrier MS, there is a gap measurement means 1 which is driven up and down by means of a device 2 (the gap measurement means is described for example in Japanese patent application HEI 9-75564).

A workpiece carrier WS holds a workpiece W by vacuum suction or other securing means. The workpiece carrier part in which the workpiece carrier WS is located has the multistage arrangement described below. On the base plate BP, by means of a first movement device D1 (hereinafter called "Z1-movement device"), there is a first carrier ZS (hereinafter called "Z-carrier ZS"). The workpiece carrier WS is located on the Z-carrier ZS by means of a second movement device D2 (hereinafter called "Z2-movement device"). The Z1-movement device D1 moves the Z-carrier ZS up and down.

A device for driving the Z-carrier ZS is described as follows. As is shown in FIG. 5, an intermediate movement carrier 11 is movably located over rolling components, such as balls or the like, on the base plate BP. The lower area of the Z-carrier ZS is provided with an obliquely running surface 12 at each of three locations (two of which are illustrated in FIG. 5). The obliquely running surfaces 12 are seated via rolling components, such as balls 14 or the like, on obliquely running surfaces 13 with which the intermediate movement carrier 11 is provided at the three corresponding locations.

The Z-carrier ZS is furthermore located over a bearing 16 in a guide 15 which is located perpendicular to the base plate BP. The guide 15 controls the direction of motion in the X-direction and the Y-direction such that the Z-carrier ZS does not move in the X-Y direction when it moves in the Z-direction (X: for example to the right and left in the drawings, Y: the direction perpendicular to the page of the drawing). The guide 15 controls movement in the X-direction. In the direction sloped 90° in this respect, there is a guide which controls movement in the Y-direction.

When the intermediate movement carrier 11 is moved by a device 17 for driving the intermediate movement carrier on the base plate BP, the Z-carrier ZS moves along the obliquely running surfaces of the intermediate movement carrier 11 in the Z-direction. In doing so, the Z-carrier ZS moves only in the Z-direction because it is moving along the guide 15. Therefore it does not move in the X-Y directions. Since the obliquely running surfaces have the same slope at these three locations, the Z-carrier ZS moves in the Z-direction while maintaining the horizontal position. The movement stroke of the Z-carrier ZS is usually 50 to 100 mm.

A stipulated gap can be set between the mask and the workpiece by the parallel movement of the Z-carrier ZS in the Z-direction in this way by means of the Z1-movement device D1. Only by vertical movement of the Z-carrier ZS is it however possible that the workpiece carrier WS is sloped with respect to the exposure device, the mask and the like. Since this slope cannot be corrected by the Z1-movement device D1, there is the Z2-movement device D2 which moves the workpiece carrier WS back and forth and adjusts it. The workpiece carrier WS is supported, for example as in FIG. 5, by workpiece carrier support parts 20 at three points which each have one workpiece carrier support component 20a which can be moved in the Z-direction. The respective workpiece carrier support component 20a executes independent motion in the Z-direction by means of a drive part 20b. In this way, the workpiece carrier WS is moved back and forth, and the Z-carrier ZS is prevented from being sloped with reference to the exposure device, the mask and the like.

The workpiece carrier support component 20a of the respective workpiece carrier support part 20 is driven by means of the drive part 20b which has, for example, a servomotor. In this way, precision movement with high accuracy is achieved while the speed of movement is low. The stroke of movement of the respective workpiece carrier support component 20a is 1 to 2 mm.

The actuation of the device shown in FIG. 5 is described as follows using FIGS. 6 and 7.

(1) To simplify transport of the workpiece W in and out the workpiece carrier WS is moved down. With consideration of the thickness of a workpiece transport finger 3 and the bending of the workpiece W, a distance of at least 50 mm is required between the mask M and the workpiece carrier WS.

(2) As is illustrated in FIG. 6, the workpiece W is held securely by the workpiece transport finger 3 and is transported on the workpiece carrier WS. In the workpiece carrier part, there are transfer pins 4 (not shown in FIG. 5) in order to transfer the workpiece W between the transport finger 3 and the workpiece carrier WS. The transport finger 3 is lowered, the workpiece W is transferred to the transfer pins 4 and the transport finger 3 is removed.

(3) As is shown in FIG. 7, the workpiece carrier WS is briefly raised by means of the Z1-movement device D1 so that the distance between the workpiece W and the mask M is set to a stipulated exposure gap. By raising the workpiece carrier WS, the workpiece W is transferred to the workpiece carrier WS by means of the transfer pins 4. The above described stipulated exposure gap will be different depending on the conditions of use, the exposure process, and the other factors. But there is usually a demand for an exposure gap of less than or equal to 100 microns because the exposure accuracy (resolution) becomes higher as the exposure gap is reduced.

(4) For a parallel arrangement of the mask M to the workpiece W, the distance between the mask M and the workpiece W is measured by means of the gap measurement means 1 shown in FIG. 5 at several points (for example at three points). Based on these measured values, the workpiece carrier WS is moved back and forth and adjusted by means of the Z2-movement device D2 so that the mask M and the workpiece W are located parallel to one another.

(5) After confirming the parallel arrangement of the mask M to the workpiece W by means of the gap measurement means 1, the exposure light is emitted via the mask M and thus exposure is done.

(6) After completion of exposure, the workpiece carrier is lowered by means of the Z1-movement device D1. The workpiece W is then transferred to the transfer pins 4. The transport finger 3 is inserted into the workpiece carrier part. The already treated workpiece is transferred from the transfer pins 4 to the transport finger 3 and transported away from the workpiece carrier part.

Recently there has been a trend for workpieces to become larger. Especially in the area of liquid crystal substrates, large substrates, measuring 550 mm×650 mm to 650 mm×830 mm, are becoming more important. Furthermore there is a growing demand for an exposure gap of less than or equal to 50 microns in order to enable exposure with high precision.

When the workpiece becomes larger and the exposure gap becomes smaller, it happens with increasing frequency that the edge of the workpiece W collides with the mask M if the workpiece carrier WS is raised such that the exposure gap (for example, a distance between the mask and the workpiece of 40 microns) is achieved and when afterwards the size of the gap is measured, the workpiece is moved back and forth and parallel adjustment is done. When the workpiece W comes into contact with the mask M, problems arise that dust forms and an expensive mask is damaged.

The reason for the collision of the edge of the workpiece W with the mask M is as follows. When the individual parts of the workpiece carrier WS are mounted, adjustment takes place as follows: The workpiece carrier WS, the Z1-movement device D1 and the Z2-movement device D2 are thus subjected to a change in position vertically by the components of thin sheets, for example shims, being inserted into installation parts so that they are located parallel to the mask M.

In the parallel adjustment by one such mechanical method, however, the disadvantages are as follows. For a large workpiece carrier of a device in which large liquid crystal substrates are exposed, the labor input is considerable. There are cases in which the slope is in the 500 micron range. Furthermore, the thickness tolerance of a large glass plate is generally ±50 microns. When the workpiece carrier WS is moved all at once, until a gap of, for example, less than or equal to 550 microns is achieved, which is smaller than the sum of the accuracy (500 microns) for mechanical, parallel adjustment and thickness tolerance (±50 microns) of the glass plate, there are therefore cases in which the edge of the workpiece W collides with the mask M. To prevent this contact of the workpiece W with the mask M, in a state in which there is a gap of greater than or equal to the above described gap (550 microns), tentative parallel arrangement is done, afterwards the gap is set smaller, and a parallel arrangement is done again. This process is repeated until the desired gap, i.e. 40 microns, is formed in parallel. But in this case, the gap measurement and measurement of the parallel adjustment must be repeated again and again. Therefore, a large amount of time for adjusting the exposure gap, and great skill for measurements and the adjustment activity, is needed.

On the other hand, in the Japanese patent disclosure document HEI 4-307550 a gap control process was proposed. Here, at a position underneath the position of the exposure gap coarse parallel adjustment is done and afterwards fine parallel adjustment at the position of the exposure gap is done.

When using the process of gap control in the Japanese patent disclosure document HEI 4-307550, however, the disadvantages are as follows for a larger workpiece W:

(1) In the embodiment described in the above described JP-OS HEI 4-307550, the position at which coarse parallel adjustment is done is defined as the position at which the distance between the mask M and the workpiece W is set to 100 microns. This two-stage adjustment consisting of the coarse parallel adjustment and the fine parallel adjustment is indeed effective when a relatively small substrate is being exposed and parallel adjustment can be done such that the mask M and the workpiece W are brought close to one another such that a distance between the two of roughly 100 microns is achieved. As was described above, for a large substrate there are cases in which the edge of the workpiece W collides with the mask M when parallel adjustment is not started at a larger gap (550 microns).

(2) Therefore, gap measurement and parallel adjustment at the position for coarse parallel adjustment, gap measurement and parallel adjustment at the position for the exposure gap and in addition gap measurement for the last check, are done several times. It is necessary to repeat these processes of gap measurement and parallel adjustment again and again. Adjustment of the exposure gap takes a long time. Furthermore skill is needed for gap measurement and the activity of parallel adjustment.

(3) The workpiece carrier has therefore been used for other purposes, besides for exposure, for a long time. As a result, the throughput of the device is adversely affected.

SUMMARY OF THE INVENTION

The invention was devised to eliminate the above described disadvantages in the prior art. Therefore the object of the invention is to provide a process for controlling a gap between a mask and a workpiece in a proximity exposure device in which there are only a few processes of measurement of the exposure gap and parallel adjustment, in which even for a large workpiece the gap between the mask and the workpiece can be controlled without contact of the workpiece with the mask, and in which no special skill is needed to adjust the gap. The object of the invention is furthermore to provide a device for executing the process.

The objects are achieved by the present invention in that, when an exposure device is being produced, the adjustment of the position of the workpiece carrier, which cannot be done solely by a mechanical method such as by shims or the like, is done by controlling the movement of the workpiece carrier.

The object is achieved by providing a device for moving a workpiece carrier composed of a first movement device and a second movement device, the latter being located on a carrier driven by the first movement device and consisting of several workpiece carrier support parts which move the workpiece carrier up and down and control its slope. The size of the gap between the bottom of a mask and the top of a workpiece located on the workpiece carrier is measured at several locations. Based on the size of the gap, the positions of the workpiece carrier support parts, when the several workpiece carrier support parts move, are recorded as a parallel zero point in a control element. The motion of the workpiece carrier support parts is executed such that the workpiece carrier is located parallel to the mask. When starting to use the device, the workpiece carrier support parts are each in a standby state after they have been moved to the parallel zero points recorded in the control element. When the workpiece is being exposed, it is placed on, and held securely to, the workpiece carrier and raised by means of the first movement device until the alignment gap position is reached. By means of the workpiece support parts of the second movement device, there is a parallel exposure gap between the mask and the workpiece and exposure is performed.

In the present invention, the process of exposure gap measurement and parallel adjustment can be reduced and, for a larger workpiece, the workpiece and the mask are prevented from contacting one another. Furthermore, parallel arrangement of the mask to the workpiece can be done without the need for special skill.

BRIEF DESCRIPTION OF THE DRAWINGS

FIG. 4 (a) shows a schematic of the arrangement of the workpiece carrier support parts and a gap measurement means in an overhead view;

FIG. 4 (b) shows a schematic of the arrangement of the workpiece carrier support parts and a gap measurement means in a side view;

DETAILED DESCRIPTION OF THE INVENTION

Figure 1:
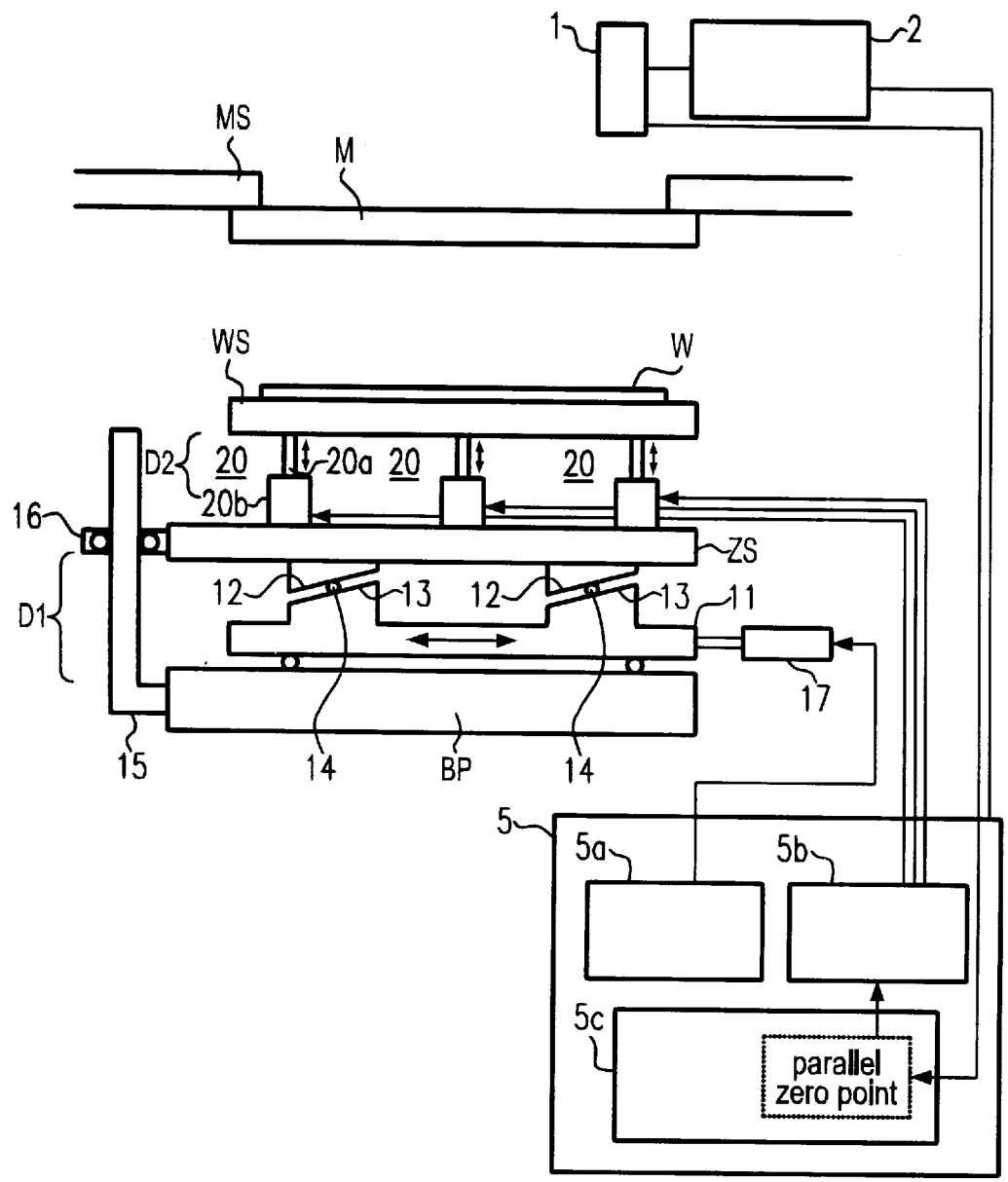
FIG. 1 shows a schematic of one embodiment of the invention.

FIG. 1 is a schematic of one embodiment of the invention. The drive device for the workpiece carrier WS is identical to the one in FIG. 5. The actuation thereof is basically also identical.

Figure 5:
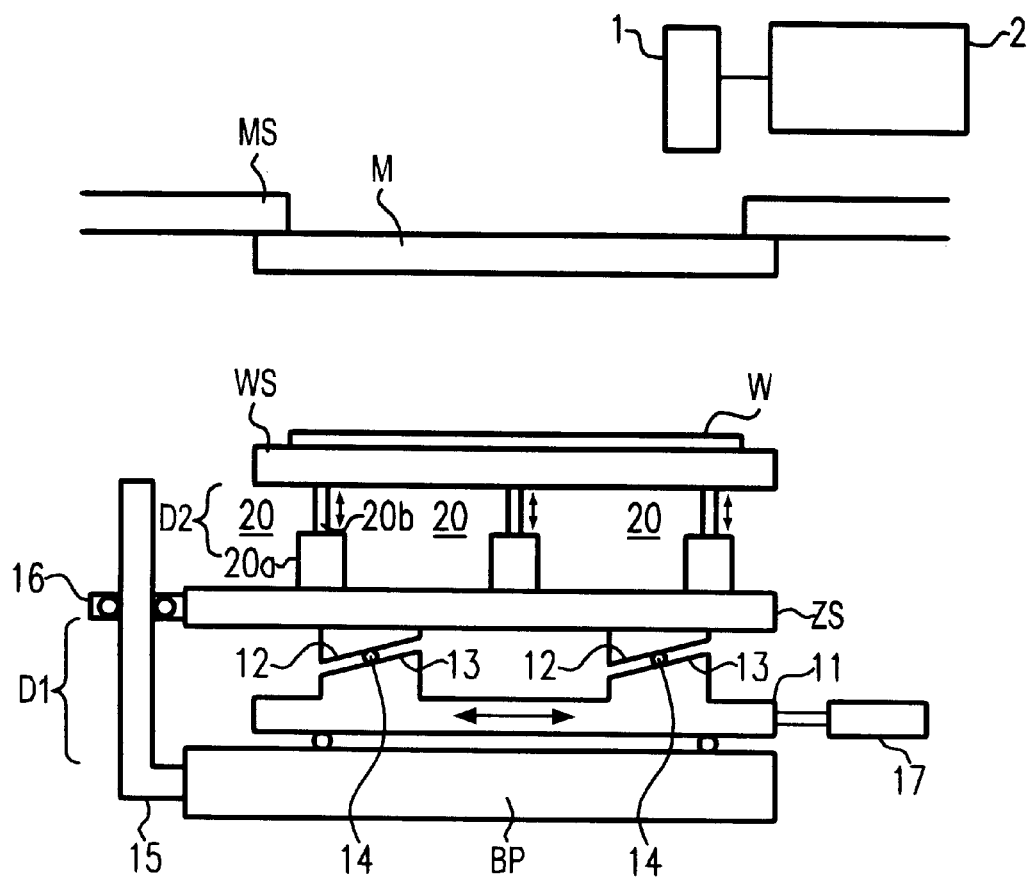
FIG. 5 shows a schematic of the basic arrangement of the proximity exposure device underlying the invention.
Figure 6:
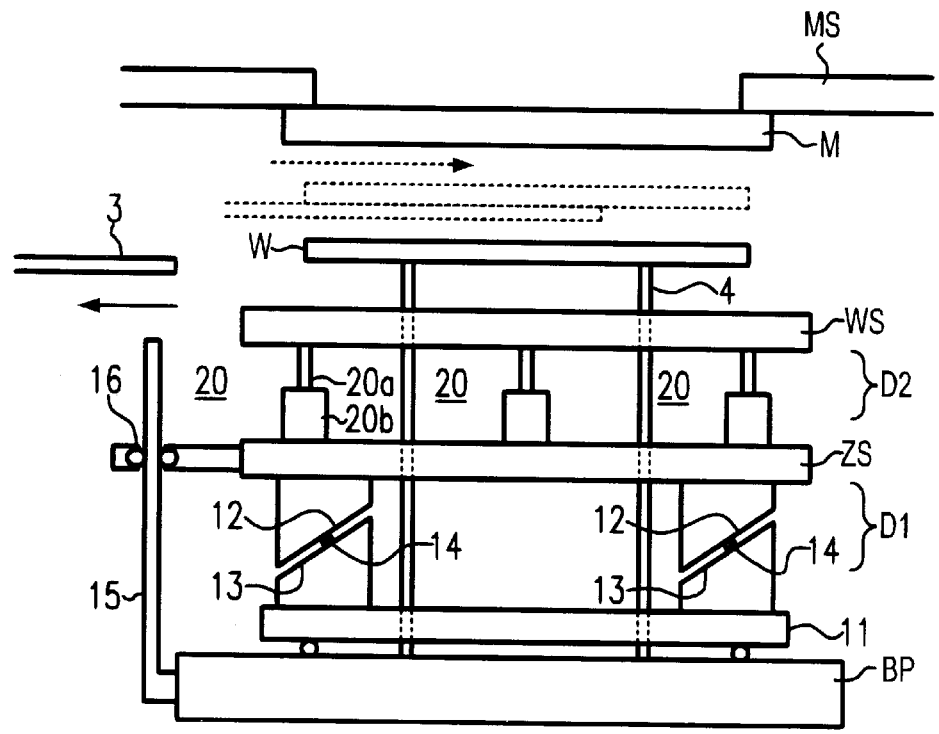
FIG. 6 shows a schematic of the state in which the workpiece is transported onto the workpiece carrier WS.
Figure 7:
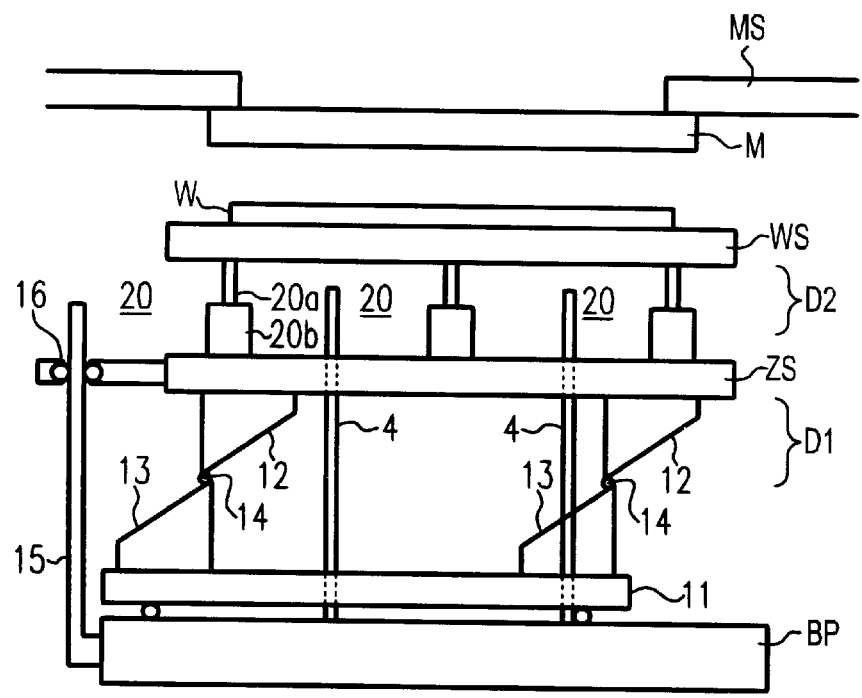
FIG. 7 shows a schematic of the state in which the workpiece carrier has been raised.

In FIG. 1, the same parts as in FIG. 5 are labeled with the same reference numbers. In this embodiment, reference number 5 indicates a control element in which a memory part 5c is located. The memory part 5c stores the positions (hereinafter called "parallel zero points") of the workpiece carrier support components 20a which arrange the workpiece carrier WS parallel to the mask.

Figure 2:
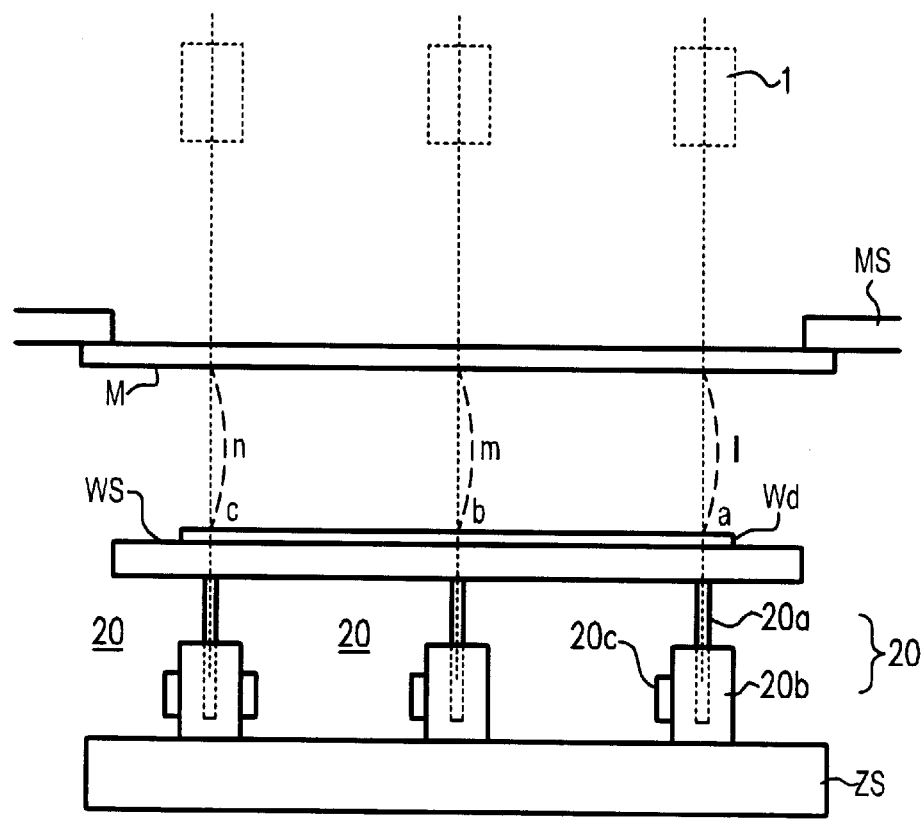
FIG. 2 shows a schematic of a state in which mechanical parallel adjustment has been completed in the embodiment of the invention.
Figure 3:
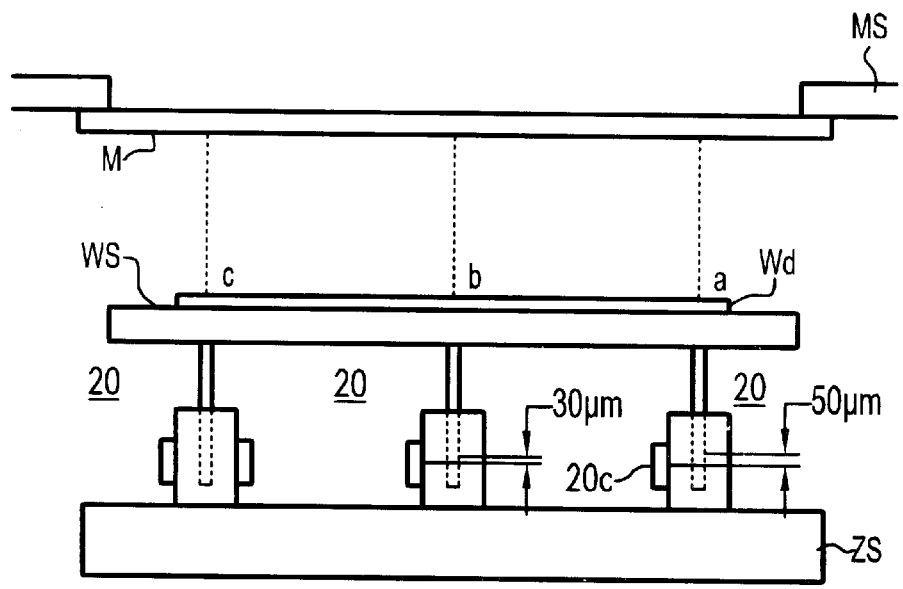
FIG. 3 shows a schematic of the state in which the adjustment of parallelism of the mask to the workpiece carrier has been completed in the embodiment of the invention.

FIGS. 2 and 3 schematically show the mask M, the workpiece carrier WS and the Z2-movement device D2 in an enlarged representation. FIGS. 4 (a) and (b) each show the arrangement of the workpiece carrier support parts 20 and the gap measurement means 1. As is illustrated in FIGS. 2 and 3, in the workpiece carrier support part 20, there is a sensor 20c which determines the position of the workpiece carrier support component 20a. The output of the sensor 20c is sent to the control element 5 shown in FIG. 1. The workpiece carrier support components 20a can be driven for example by a servomotor provided with a coder. The output of the coder is used as the output of the sensor 20c.

As is shown in FIG. 4 (a) and FIG. 4 (b), in this embodiment, the workpiece carrier support parts 20 are located at three points on the Z-carrier ZS. Furthermore, above the positions at which the workpiece carrier support parts 20 are installed, the gap measurement means 1 is located perpendicular thereto.

In this embodiment, the adjustment of the gaps is described using FIGS. 2, 3, 4(a) and 4(b) as follows.

(A) Adjustment before exposure

First, in the adjustment of the device, the adjustment described below in (1) to (9) is performed.

(1) Initially, the support components 20a of the support parts 20 are each in a stroke end state (in the lowest state). In this state, mechanical parallel adjustment of the workpiece carrier WS to the mask M is done by means of shims or the like.

(2) FIG. 2 shows a state in which the above described mechanical parallel adjustment has been completed. One such state, in which the movement part of the respective drive means of the device is in the stroke end state and position adjustment in the mounting of the device parts has been completed, is called the "mechanical zero point". In some cases, the accuracy of parallel adjustment in this stage has an error of 500 microns, as was described above.

(3) Then parallel adjustment is done by driving the Z2-movement device D2.

(4) First, a dummy workpiece Wd of blank glass with the same thickness as that of the actual workpiece W is placed on the workpiece carrier WS. In the state in which the device is located at the mechanical zero point, the Z1-movement device D1 is driven. By means of the gap measurement means 1, the workpiece carrier WS is raised until a position (for example a distance of 600 microns) is reached on which the gap distance between the mask M and the dummy workpiece Wd can be measured.

(5) The gap measurement means 1 measures the gap distances 1, m and n between the mask M and the dummy workpiece Wd at three locations a, b and c in FIG. 2 (the three measurement points a, b, and c are illustrated in FIG. 4).

(6) It is assumed that the measurement values were as follows.

l=650 microns, m=630 microns, n=600 microns This shows that the workpiece carrier WS is tilted by 50 microns with reference to the mask M at points a to c. Since the workpiece carrier WS becomes parallel to the mask M when l=m=n, the amount of movement of the respective workpiece carrier support component 20a is input in the control element 5 such that 50 microns lifting is done at point a with respect to the workpiece carrier support component 20a and 30 microns lifting is done at point b with respect to the workpiece carrier support component 20a.

(7) A control means 5b for the Z2-movement device of the control element 5 drives the servomotor of the drive part 20b until the output of the encoder installed in the servomotor of the workpiece carrier support part 20 reaches a number of pulses corresponding to the above described amount of motion. Thus the workpiece carrier support components 20a are moved. After movement, the distance between the mask M and the workpiece W is measured once again by the gap measuring means 1. The above described adjustment and measurements are repeated until the parallelism reaches an allowable range.

(8) FIG. 3 shows a state in which the adjustment of the parallelism of the workpiece carrier WS with respect to the mask M has been completed. In the above described example, the support component at point a moves 50 microns and the support component at point b moves 30 microns from the end stroke (i.e. from the mechanical zero point). The position of the respective workpiece carrier support component 20a in this state is called the parallel zero point.

(9) The positions of the parallel zero points with reference to the above described mechanical zero point, i.e. 50 microns with respect to the support component at point a, 30 microns with respect to the support component at point b, and 0 microns at point c, are recorded as correction values of the workpiece carrier support components in the memory part 5c of the control element 5. The processes to date are carried out when the device is adjusted.

In actual use of the exposure device, the preparations described below in (10) and (11) are performed.

(10) During the actual use of the exposure device, the exposure device is started causing the control element 5 to drive the respective workpiece carrier support part 20 of the Z2-movement device D2. After determining the mechanical zero point by a sensor, as a result of the recorded correction value, the respective workpiece carrier support component 20a is moved to the parallel zero point. In this way, the parallelism of the workpiece carrier WS to the mask M is in the standby state in which the precision adjustment has been completed.

(11) This precision adjustment enables the conditions for preventing contact of the mask with the workpiece to be achieved without special skill while at the same time lifting them at one time until a distance of less than or equal to 100 microns is achieved and placing them parallel to one another at the same time. In this state, the device is prepared for the workpiece.

(B) Actuation for exposure of the workpiece (1) The exposure gap to be adjusted between the mask and the workpiece is, for example, 40 microns and is stored beforehand in the memory part 5c of the control element 5.

(2) The workpiece W is placed on the workpiece carrier WS.

(3) The intermediate movement carrier 11 of the Z1-movement device D1 is driven by a control means 5a for the Z1-movement device of the control element 5. The Z-carrier ZS moves in the Z-direction. As a result, the workpiece carrier WS is moved in the Z-direction and is raised at high speed until an alignment gap (for example 100 microns) is reached within the focal depth of an alignment microscope with a magnification factor of 1 to 3× that of the first stage of positioning (alignment) of the mask M to the workpiece W. A magnification factor of 1 to 3× means that the images of the articles to be viewed (alignment marks) on a CCD camera of the alignment microscope are projection magnified by 1 to 3 times.

(4) As was described above, precision adjustment of the parallelism of the workpiece carrier WS to the mask M is done by the above described parallel zero points. Therefore, this is the disadvantage of parallelism (variation of the thickness) of the workpiece W. Since the parallelism (variation of the thickness) of the workpiece W is roughly 50 microns, there is no danger that the workpiece W will collide with the mask M even if the workpiece carrier WS on which the workpiece W is placed is raised to the alignment gap (100 microns).

(5) When the substrate becomes even larger and when the undulations of the substrate become larger, the alignment of the mask M to the workpiece W is done as follows. First, positioning by the alignment microscope is done with 1 to 3× at a gap width between the mask M and the workpiece W of 300 microns. Next, positioning by the alignment microscope of 10× is done at a gap width of 100 microns up to the exposure width (for example 40 microns).

(6) The mask M and the workpiece W are positioned in the X-Y direction to one another. On the mask M and the workpiece W, alignment marks are recorded which are determined with an alignment microscope which is not shown in the drawings. The mask carrier MS or the workpiece carrier WS is moved in the X-Y-Θ directions such that the alignment marks of the mask M and of the workpiece W come to rest on top of one another. In this way positioning is done.

(7) The gap measurement means 1 is moved by the device 2 for driving the gap measurement means. In this way the distance between the mask M and the workpiece W is measured. As shown in FIG. 4, the measurement is taken above the workpiece carrier support parts 20 and perpendicular thereto, i.e. at the three points a, b, and c.

(8) The gap distances 1, m and n which correspond to the three points a, b and c are measured and the measured values are sent to the control element 5. It is assumed that the measured values were as follows;

l=135 microns m=145 microns n=160 microns

The control element 5 performs a computation, i.e. (measured value of the respective gap)−(numerical value of the adjusted exposure gap).

at point a: 135 microns−40 microns=95 microns at point b: 145 microns−40 microns=105 microns at point c: 160 microns−40 microns=120 microns (9) Based on the results of the computation, the control means 5b for the Z2-movement device of the control element 5 outputs a signal to the respective drive part 20b, so that the workpiece carrier support component 20a which corresponds to the respective position is moved by the above described distance. The respective point therefore moves as follows:

point a=95 microns point b=105 microns point c=120 microns

When point a has been moved upward by 95 microns, the workpiece carrier support component 20a which corresponds to point a stops to move. At this time, point b and point c are still moving. When point b and point c reach the respective amount of movement, the workpiece carrier support component 20a which corresponds to the respective point stops to move.

(10) The workpiece carrier WS executes parallel adjustment of the mask M to the workpiece W and reaches the exposure gap.

(11) For confirmation purposes, the distance between the mask M and the workpiece W is measured by the gap measurement means 1 at three points a, b and c.

(12) When the numerical value of the measured gap width is in the allowable range with respect to the adjusted exposure gap, exposure is done. If it is outside the allowable range, the workpiece carrier support components 20a are moved again and parallel adjustment is done. This process is repeated until the gap widths are in the allowable range.

As was described above, when the device is adjusted, control of the movement of the workpiece carrier movement device is effected and the parallelism of the workpiece carrier to the mask undergoes precision adjustment. The locations at which this precision adjustment has taken place are called parallel zero points and are recorded in the memory part of the control element. At the start of use of the device, the device for driving the workpiece carrier is moved to the parallel zero points and thus into the standby state. This measure makes it possible to establish the position for parallel adjustment of the workpiece to the mask only with consideration of the tolerance of the workpiece thickness. Therefore, even with a larger workpiece, the workpiece is prevented from coming into contact with the mask. The workpiece carrier can be raised at a relatively high speed until the position, which has been brought closer to the mask for parallel adjustment, is reached. Therefore, the time for parallel adjustment can be shortened and the throughput increased. Furthermore, parallel arrangement of the mask to the workpiece can be done without the need for expertise.

I claim:

1. A process for controlling a gap between a mask and a workpiece in a proximity exposure device, comprising the steps of:

providing a device for moving a workpiece carrier, said device including a first movement device for moving a first carrier up and down and a second movement device, the second movement device being located on a carrier driven by the first movement device and including several workpiece carrier support parts which move the workpiece carrier up and down and control a slope of the workpiece carrier;

placing an alignment workpiece on the workpiece carrier and raising the workpiece carrier using the first movement device to a position at which a gap between a bottom of a mask and a top of the alignment workpiece located on the workpiece carrier has a size that can be measured;

measuring the size of the gap at several locations;

recording a position of each of the workpiece carrier support parts as a respective parallel zero point in a control element after movement of the several workpiece carrier support parts of the second movement device is executed such that the workpiece carrier is located parallel to the mask;

removing the alignment workpiece from the workpiece carrier and providing each of the workpiece carrier support parts in a standby state after respective movement to respective parallel zero points recorded in the control element;

mounting a workpiece to be exposed on the workpiece carrier while the workpiece carrier support parts are in said standby state at said respective parallel zero points recorded in the control element;

raising the workpiece to be exposed by means of the first movement device until an alignment gap position is reached; and adjusting the slope of the workpiece carrier using the second movement device and raising the workpiece to be exposed until an exposure gap position which is parallel to the mask is reached.

2. A proximity exposure device in which a mask and a workpiece are brought close to one another, exposure light is emitted via the mask onto the workpiece and a mask pattern is transferred to the workpiece, comprising:

a first movement device for moving a first carrier up and down with respect to a base;

a second movement device including several workpiece carrier support parts which move a workpiece carrier up and down with respect to the first carrier and adjust a slope of the workpiece carrier, the workpiece carrier support parts each including a workpiece carrier support component which moves integrally with the workpiece carrier, a drive part for driving the respective workpiece carrier support component and a means for determining the position of the respective workpiece carrier support component up and down;

means for measuring the size of a gap, between the mask and a workpiece on the workpiece carrier, at several locations; and a control element which controls the drive of the first and the second movement devices, the control element including a memory means for recording a position of parallel zero points of the respective workpiece carrier support component which places the workpiece carrier parallel to the mask, wherein the control element is adapted to move the respective workpiece carrier support component to the position of parallel zero points which have been recorded in the memory means and thereby shift the respective workpiece carrier support component into a standby state, wherein the first movement device is adapted to cause the workpiece carrier to approach the mask, and the second movement device is adapted to adjust the slope of the workpiece carrier.

* * * * *